(12) United States Patent  
Nakaya

(10) Patent No.: US 7,649,163 B2  
(45) Date of Patent: Jan. 19, 2010

(54) PHOTOMULTIPLIER TUBE MODULE HAVING HIGH-VOLTAGE GENERATING CIRCUIT AND DIGITAL CIRCUIT

(75) Inventor: Takanori Nakaya, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/060,532

(22) Filed: Apr. 1, 2008

(65) Prior Publication Data

US 2008/0245951 A1    Oct. 9, 2008

(30) Foreign Application Priority Data

Apr. 4, 2007    (JP) .......................... P2007-098742

(51) Int. Cl.  
*H01J 40/14* (2006.01)

(52) U.S. Cl. .............................. 250/207; 250/214 VT; 313/528; 313/532; 313/542

(58) Field of Classification Search .................. 250/207, 250/214 VT, 214.1, 214 R, 239; 313/523, 313/528, 531, 532, 542  
See application file for complete search history.

(56) References Cited

U.S. PATENT DOCUMENTS 5,187,538 A * 2/1993 Iwamoto et al. ............ 356/28.5

FOREIGN PATENT DOCUMENTS

| DE | 3611685 A1 * | 10/1986 |
| JP | 2003-130726 | 5/2000 |
| JP | 2004-125626 | 4/2004 |
| JP | 2005-030972 | 2/2005 |

OTHER PUBLICATIONS

Machine Translation JP Patent No. 2005030972 Takashi, Publication date Feb. 3, 2005.*

* cited by examiner

*Primary Examiner*—Thanh X Luu  
*Assistant Examiner*—Francis M Legasse, Jr.  
(74) *Attorney, Agent, or Firm*—Drinker Biddle & Reath LLP

(57) ABSTRACT

An extension line of a tube axis of a photomultiplier tube is shifted from the center of gravity position of a front surface of a housing, which allows a space to be formed at an opposite side in the housing. A signal processing board is arranged in this space, and a high-voltage generating circuit board is fixed on the extension line of the tube axis, and thus the interior space of a housing can be effectively used. Since the signal processing board can be made adjacent to a tube wall of the photomultiplier tube, even when the length in a tube axis direction of the signal processing board is long, it becomes possible to house the same in the housing. Therefore, it becomes possible to achieve miniaturization.

5 Claims, 5 Drawing Sheets

PHOTOMULTIPLIER TUBE MODULE HAVING HIGH-VOLTAGE GENERATING CIRCUIT AND DIGITAL CIRCUIT

BACKGROUND OF THE INVENTION

1. Field of the Invention

The present invention relates to a photomultiplier tube module.

2. Related Background Art

Conventionally, a photomultiplier tube module formed by incorporating a photomultiplier tube in a housing is known as a unit capable of detecting weak light. The photomultiplier tube module described in Patent Document 1 (Japanese Patent Application Laid-Open No. 2004-125626) applies a high voltage to a photomultiplier tube and processes an output signal from the photomultiplier tube by a signal processor. The photomultiplier tube modules described in Patent Document 2 (Japanese Patent Application Laid-Open No. 2005-30972) and Patent Document 3 (Japanese Patent Application Laid-Open No. 2003-130726) control incidence of light by attaching a shutter on the side of a light incident surface of a photomultiplier tube. These photomultiplier tube modules, despite being small-sized, function as excellent detectors that enable detection of weak light.

Particularly, for the photomultiplier tube module described in Patent Document 2, an amplifier board that amplifies an output signal from the photomultiplier tube is incorporated in a housing, and the amplified output signal can be outputted to the outside. The amplifier board is arranged parallel to a tube axis of the photomultiplier tube.

SUMMARY OF THE INVENTION

However, a further miniaturization has been expected for the photomultiplier tube modules described above. The present invention has been made in view of such a challenge, and it is an object of the present invention to provide a photomultiplier tube module with a structure that achieves a further miniaturization.

In order to solve the challenge described above, a photomultiplier tube module according to the present invention includes: a photomultiplier tube which is fixed in a housing, whose light incident surface is arranged on a side of a front surface of the housing, and an extension line of a tube axis of which is provided isolated from a center of gravity position of the front surface; a high-voltage generating circuit board which is fixed in the housing, whose board surface is arranged so as to intersect the extension line of the tube axis, and which applies an operating voltage to the photomultiplier tube; and a signal processing board which is fixed in the housing and located on a side opposite to a direction toward the tube axis from the center of gravity position, whose one end portion is adjacent to a tube wall of the photomultiplier tube, whose board surface is parallel to the tube axis, and which processes an output signal of the photomultiplier tube that flows in from a region on a side of the one-end portion.

The photomultiplier tube operates as a result of being inputted with the operating voltage from the high-voltage generating circuit board. In operation of the photomultiplier tube, when photons are made incident into the light incident surface, the photomultiplier tube outputs a pulse current. This pulse current flows in the signal processing board from the region on the one-end portion side of the signal processing board to be applied with a signal processing.

Here, the extension line of the tube axis of the photomultiplier tube is shifted from the center of gravity position of the front surface of the housing, which allows a space to be formed at the opposite side in the housing. The signal processing board is arranged in this space, and at least a part of the high-voltage generating circuit board is fixed on the extension line of the tube axis, and thus the interior space of the housing can be effectively used. Since the signal processing board can be made adjacent to the tube wall of the photomultiplier tube, even when the length in the tube axis direction of the signal processing board is long, it becomes possible to house the same in the housing. Therefore, it becomes possible to achieve miniaturization.

Moreover, it is preferable that the photomultiplier tube has a tube axis length shorter than a size of the signal processing board in a direction parallel to the tube axis. In this case, since it becomes possible to secure a sufficient space to arrange the high-voltage generating circuit board behind the output side of the photomultiplier tube, the photomultiplier tube, the high-voltage generating circuit board, and the signal processing board can be compactly housed in the housing.

Moreover, it is preferable that the signal processing board includes: a digital circuit which is provided on an outside surface of the signal processing board located on a side opposite to an inside surface opposed to the photomultiplier tube and which digitally processes an output signal from the photomultiplier tube; and a metal layer provided between the digital circuit and the photomultiplier tube and the high-voltage generating circuit board and connected to a ground.

Since the metal layer connected to the ground is interposed between the digital circuit and the photomultiplier tube and the high-voltage generating circuit board, noise propagating between these can be suppressed while miniaturization of the module is achieved.

Moreover, it is preferable that the photomultiplier tube module further includes a conductive fixing member fixed to an inside surface of a side wall of the housing, the side wall including the front surface, wherein the signal processing board is fixed by the conductive fixing member so that the metal layer is electrically connected to the conductive fixing member, and the housing is formed of a conductive material.

In this case, by supporting the signal processing board by the conductive fixing member and electrically connecting the metal layer to the conductive fixing member, the metal layer is connected to the housing ground made of a conductive material, and therefore, a photomultiplier tube module that is small-sized and excellent in a noise shielding effect can be provided.

Furthermore, it is preferable that the digital circuit includes: a comparator in which an output signal of the photomultiplier tube is inputted; and a signal processor that outputs a digital value according to a number of square waves outputted from the comparator. The above-described structure is effective for photon counting where a weak noise becomes a problem, and by outputting a digital value according to the number of square waves by the signal processor, photodetection of a photon level is enabled.

Moreover, it is preferable that the photomultiplier tube module includes: a holder which is fixed to an inside surface of a side wall including the front surface of the housing and which supports a region on a side of the light incident surface of the tube wall of the photomultiplier tube; and a resin material applied between stem pins of the photomultiplier tube and from a region on a side opposite to the light incident surface of the tube wall of the photomultiplier tube to a position to contact the holder.

In this case, the photomultiplier tube can be reliably held by the holder and the resin material prevents dust and water drops from intruding between the holder and the photomultiplier tube, whereby short-circuiting between the stem pins due to dust and water drops can be prevented. Moreover, insulation by the resin material makes it also possible to suppress an electromagnetic noise generated when a high voltage is applied to these.

According to the photomultiplier tube module of the present invention, miniaturization can be achieved.

DESCRIPTION OF THE PREFERRED EMBODIMENTS

Hereinafter, a photomultiplier tube module according to an embodiment will be described. Here, identical elements are designated with identical numerical symbols so as to avoid overlapping descriptions.

Figure 1:
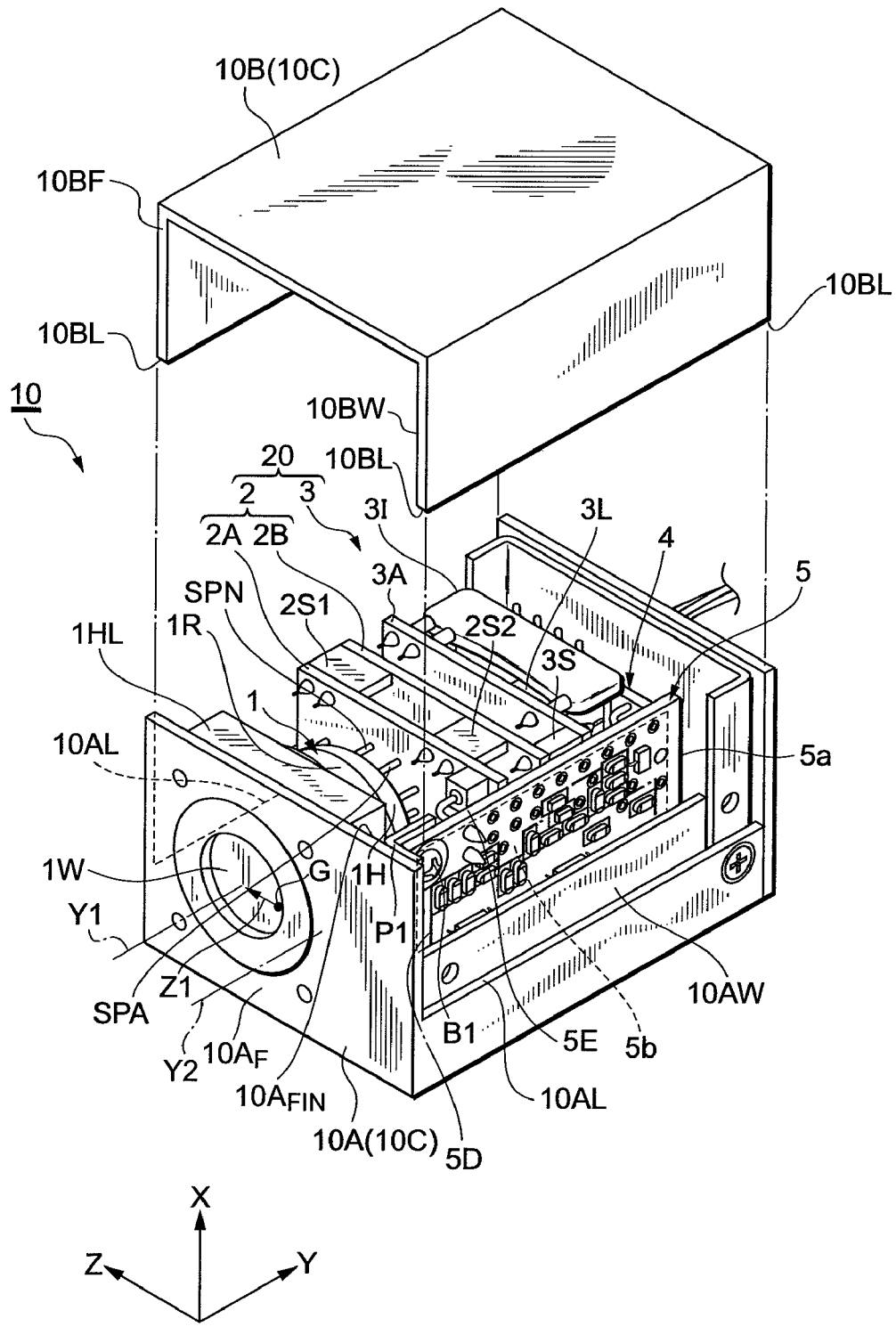
FIG. 1 is a perspective view of a photomultiplier tube module according to an embodiment.

FIG. 1 is a perspective view of a photomultiplier tube module according to an embodiment. In the same figure, a state where a cover member 10B is removed from a housing body 10A is shown. In addition, an XYZ three dimensional coordinate system is set as illustrated.

A photomultiplier tube module 10 includes a housing (frame) 10C composed of the housing body 10A and the cover body 10B. The housing body 10A has, on an outside surface of a pair of side walls 10AW located lateral to a front surface 10A$_F$, terrace surfaces 10AL from the surface to the inside of the housing body 10A, and a step is formed between the terrace surface 10AL and a surrounding side surface. The respective terrace surfaces 10AL are extended along a Y-axis direction.

The cover member 10B has a laid U-shape as a sectional shape in an XZ plane, and has a top plate 10BF and a pair of side wall plates 10BW extending in a negative X-axis direction from both ends in a Z-axis direction of the top plate 10BF. When respective end portions 10BL in the negative X-axis direction of the pair of side wall plates 10BW are brought in contact with the terrace surfaces 10AL, an inside surface of each side wall plate 10BW and an outside surface of each side wall 10AW of the housing body 10A contact face-to-face to block an opened region of the housing body 10A located above in the drawing.

In the housing 10C, incorporated is a photomultiplier tube 1, a high-voltage generating circuit consisting of a voltage divider 2 and a transformer circuit 3, a signal input/output board 4, and a signal processing board 5.

The photomultiplier tube 1 is fixed in the housing 10C, and its face plate serving as a light incident surface 1W is arranged on the front surface 10A$_F$ side of the housing 10C. An extension line Y1 of a tube axis of the photomultiplier tube 1 is provided isolated in the Z-axis direction from a center of gravity position G of the front surface 10A$_F$.

A high-voltage generating circuit board 20 consisting of the voltage divider 2 and the transformer circuit 3 is fixed in the housing 10C, and respective board surfaces of a plurality of circuit boards 2A, 2B, and 3A of these are arranged so as to be orthogonal (intersect) with the extension line Y1 of the tube axis. The high-voltage generating circuit board 20 is thus an aggregate of the plurality of circuit boards, and this applies an operating voltage to the photomultiplier tube 1.

The voltage divider 2 consists of the circuit boards 2A and 2B arranged opposite to each other, and a plurality of insulating spacers 2S1 and 2S2 are interposed between the circuit boards 2A and 2B. On the circuit boards 2A and 2B, Cockcroft circuits or voltage doubler rectifiers to raise an inputted AC voltage to generate a DC voltage are mounted in a physically separated manner. The voltage doubler rectifiers are circuits each composed of a plurality of diodes and capacitors and including, in a broad sense, a transformer 3L of a preceding stage. In the present example, the circuit boards 2A and 2B are laminated in a lengthwise direction to separate these, whereby the size in a transverse direction is reduced. Moreover, the circuit board 2A, which is mounted with a major part of a voltage dividing function, divides the DC voltage generated as described above to generate a plurality of voltages to be supplied to respective dynodes in the photomultiplier tube 1.

The transformer circuit 3 generates an AC voltage to be inputted to the voltage double rectifier. The transformer circuit 3 has the circuit board 3A mounted with the transformer 3L and a control circuit 3I, and an insulating spacer 3S is interposed between the circuit boards 3A and 2B. The control circuit 3I, which is for generating an AC voltage to be applied to an input-side coil of the transformer 3L, generates an AC voltage with a predetermined frequency from a DC voltage and a clock signal inputted to the control circuit 3I, for example. Switching the inputted DC voltage in synchronization with the clock signal allows generating an AC voltage synchronized with a switching frequency, and when a clock frequency is changed by use of an appropriate programmable frequency divider, the switching frequency can be changed in synchronization therewith. To an output-side coil of the transformer 3L, an AC voltage almost proportional to a turns ratio between the input and output transformer windings is outputted, and the voltage is raised.

The signal input/output board 4 is for connecting the internal circuits of the photomultiplier tube module 10 with the outside, and also includes a clock generator, an oscillator, or the like according to necessity.

A signal processing board 5 is fixed in the housing 10C, and is located on the side opposite, with respect to the photomultiplier tube 1, to a direction Z1 toward the tube axis (extension line Y1) from the center of gravity position G. One end portion 5E in a negative Y-axis direction of the signal processing board 5 is adjacent to a tube wall 1H of the photomultiplier tube 1, and the board surface of the signal processing board 5 is parallel to the tube axis (extension line Y1). Here, being adjacent in the present example means an isolated state with a slight gap.

Thus, the extension line Y1 of the tube axis of the photomultiplier tube 1 is shifted from the center of gravity position G of the housing front surface 10A$_F$, which allows a space to be formed at the opposite side of shifting in the housing. The signal processing board 5 is arranged in this space, and the high-voltage generating circuit board 20 is fixed on the extension line Y1 of the tube axis, and thus the interior space of the housing can be effectively used. Since the signal processing board 5 can be made adjacent to the tube wall 1H of the photomultiplier tube 1, even when the length in the tube axis direction (Y-axis direction) of the signal processing board 5 is long, it becomes possible to house the same in the housing 10C. Therefore, it becomes possible to achieve miniaturization.

Moreover, the photomultiplier tube 1 has a tube axis length shorter than the size of the signal processing board 5 in the direction (Y-axis) parallel to the tube axis. In this case, since it becomes possible to secure a sufficient space to arrange the high-voltage generating circuit board 20 behind the output side of the photomultiplier tube 1, the photomultiplier tube 1, the high-voltage generating circuit board 20, and the signal processing board 5 can be compactly housed in the housing 10C.

A stem pin SPN for inputting the operating voltage to the photomultiplier tube 1 and a stem pin SPA for outputting an output signal from an anode are fixed to the circuit board 2A. The output signal of the photomultiplier tube 1 outputted from the stem pin SPA flows in a region on the one-end portion 5E side of the signal processing board 5 via the circuit board 2A. The output signal thus flowed in is processed by the signal processing board 5.

The signal processing board 5 includes a wiring board 5a prepared by forming a plurality of wirings on an insulating substrate, a digital circuit 5D mounted on the wiring board 5a, and a metal layer 5b embedded inside the wiring board 5a. The digital circuit 5D is provided on an outside surface of the signal processing board 5 located on the side opposite to an inside surface opposed to the photomultiplier tube 1. The digital circuit 5D digitally processes the output signal from the photomultiplier tube 1.

The metal layer 5b is provided between the digital circuit 5D and the photomultiplier tube 1 and the high-voltage generating circuit board 20 and connected to a ground. Since the metal layer 5b connected to the ground is interposed between the digital circuit 5D and the photomultiplier tube 1 and the high-voltage generating circuit board 20, noise propagating between these can be suppressed while miniaturization of the module is achieved. Particularly, the digital circuit 5D has a large switching noise, and the noise is easily superimposed on the output signal of the photomultiplier tube 1. It has therefore been difficult to install the digital circuit 5D in the vicinity of the photomultiplier tube 1, however, providing the metal layer 5b makes it possible to suppress the superimposed noise and install the digital circuit 5D in the vicinity of the photomultiplier tube.

To an inside surface $10A_{FIN}$ of the side wall of the housing, the side wall including the front surface $10A_F$ of the housing body 10A, fixed is a conductive fixing member P1. The conductive fixing member P1 is a member whose section in a YZ plane has an L-shape, and a part including one side of the letter L is fixed to the inside surface $10A_{FIN}$ by welding or the like, while by passing a metallic bolt B1 through a part including the other side of the letter L and one end portion of the wiring board 5a, the wiring board 5a is fixed to the conductive fixing member P1. The metal layer 5b is electrically connected to the conductive fixing member P1 via the bolt B1. In other words, the signal processing board 5 is fixed by the conductive fixing member P1 so that the metal layer 5b is electrically connected to the conductive fixing member P1. Also, the housing 10C to which the conductive fixing member P1 is fixed is also made of a conductive material.

In the case of the structure described above, by supporting the signal processing board 5 by the conductive fixing member P1 and electrically connecting the metal layer 5b to the conductive fixing member P1, the metal layer 5b is connected to the ground of the housing made of a conductive material. Therefore, the photomultiplier tube module 10 is small-sized and excellent in a noise shielding effect.

Moreover, the photomultiplier tube module 10 includes a holder 1HL fixed to the inside surface $10A_{FIN}$ of the side wall including the front surface $10A_F$ of the housing 10C. The external form of the holder 1HL is a rectangular parallelepiped whose sides in the Y-axis direction are set short, and the holder 1HL has a through-hole defined by a cylindrical surface along the Y-axis. The inner surface of the through hole in the holder 1H supports a region on the light incident surface 1W side of the tube wall 1H of the photomultiplier tube 1.

Moreover, a black resin material 1R is applied between the stem pins SPN and SPA of the photomultiplier tube 1 and from a region on the side opposite to the light incident surface 1W of the tube wall 1H of the photomultiplier tube 1 to a position to contact the holder 1HL.

In the case of this structure, the photomultiplier tube 1 can be reliably held by the holder 1HL and the resin material 1R prevents dust and water drops from intruding between the holder 1HL and the photomultiplier tube 1, whereby short-circuiting between the stem pins SPN and SPA due to dust and water drops can be prevented. Moreover, insulation by the resin material 1R makes it also possible to suppress an electromagnetic noise generated when a high voltage is applied to these and a change in temperature during operation, and by using the black resin, not only can incidence of light into the photomultiplier tube 1 from a part other than the light incident surface 1W be blocked, but reflection of stray light made incident into the photomultiplier tube module 10 can also be suppressed.

Figure 2:
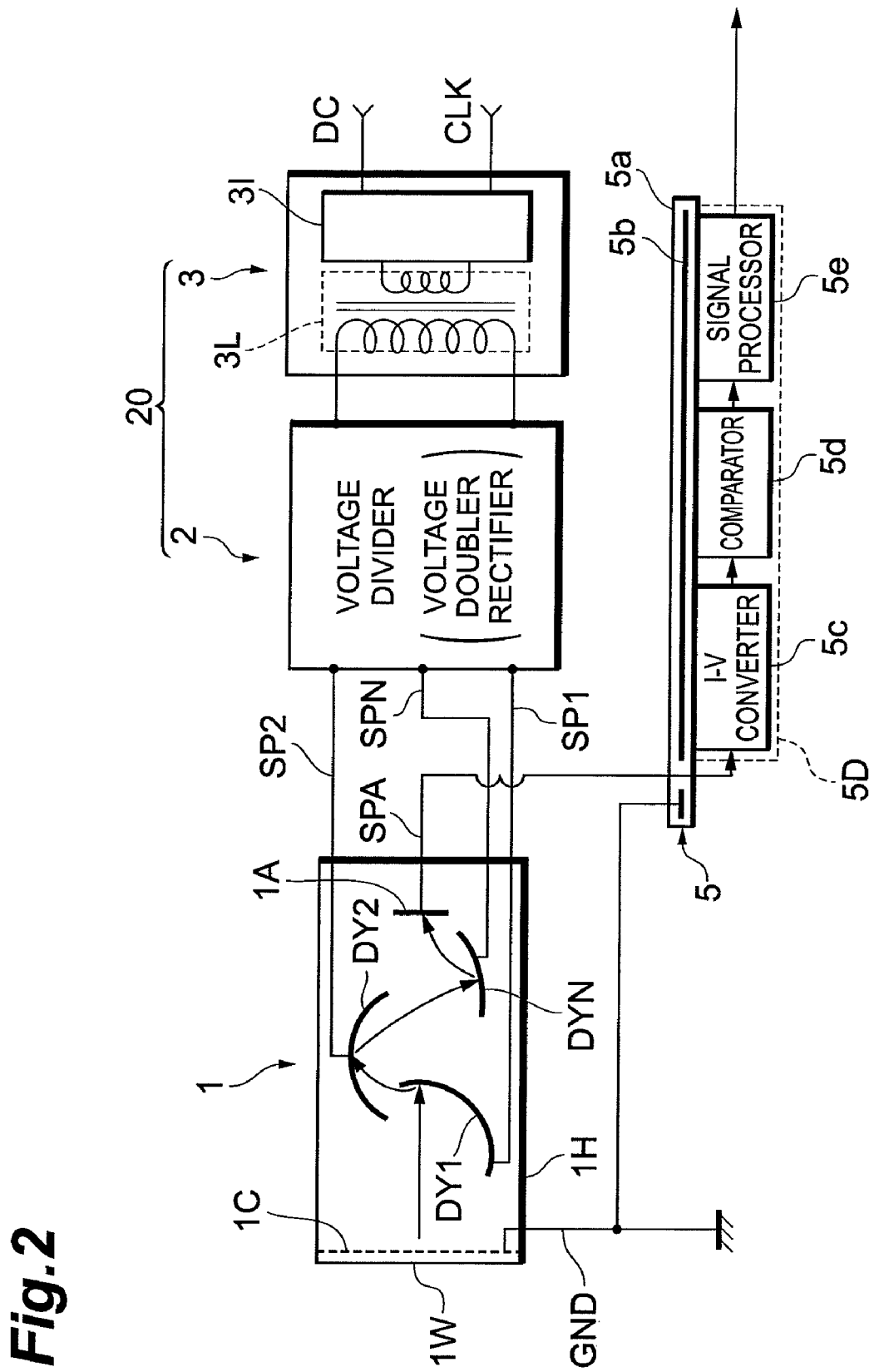
FIG. 2 is a circuit diagram of a photomultiplier tube module 10.

FIG. 2 is a circuit diagram of the photomultiplier tube module 10.

When an operating voltage from the high-voltage generating circuit board 20 described above is inputted to the photomultiplier tube 1, the operating voltage is applied to respective dynodes DY1, DY2, . . . , and DYN via the stem pins SP1, SP2, . . . , and SPN of the photomultiplier tube 1, so that the photomultiplier tube 1 operates. Also, a photocathode 1C is electrically connected to a ground GND along with the metallic tube wall 1H, that is, connected to the housing 10C. It has been set such that the later stage of the dynodes DY1, DY2, . . . , and DYN has a higher potential and photoelectrons generated at the photocathode 1C travel to an anode A1.

In operation of the photomultiplier tube 1, when photons are made incident into the light incident surface 1W, the photomultiplier tube 1 outputs a pulse current from the stem pin SPA. More specifically, photoelectrons emitted from the photocathode 1C in response to the incidence of photons are amplified by the dynodes DY1, DY2, . . . , and DYN, then collected in the anode 1A, and outputted as a pulse current from the stem pin SPA electrically connected to the anode 1A. This pulse current flows in the signal processing board 5 from the region on the one-end portion 5E side of the signal processing board 5 to be applied with a signal processing.

The digital circuit 5D mounted on the signal processing board 5 includes a current-voltage converter (I-V converter) 5c that converts a pulse current outputted from the photomultiplier tube 1 to a voltage and a comparator 5d to which an output voltage of the current-voltage converter 5c is inputted. That is, the output signal of the photomultiplier tube 1 is inputted to the comparator 5d. The digital circuit 5D further includes a signal processor 5e connected at a subsequent stage of the comparator 5d, and this outputs a digital value according to the number of square waves outputted from the comparator 5d. This number of square waves is proportional to the number of photons made incident, and thus photon counting is enabled.

Figure 3:
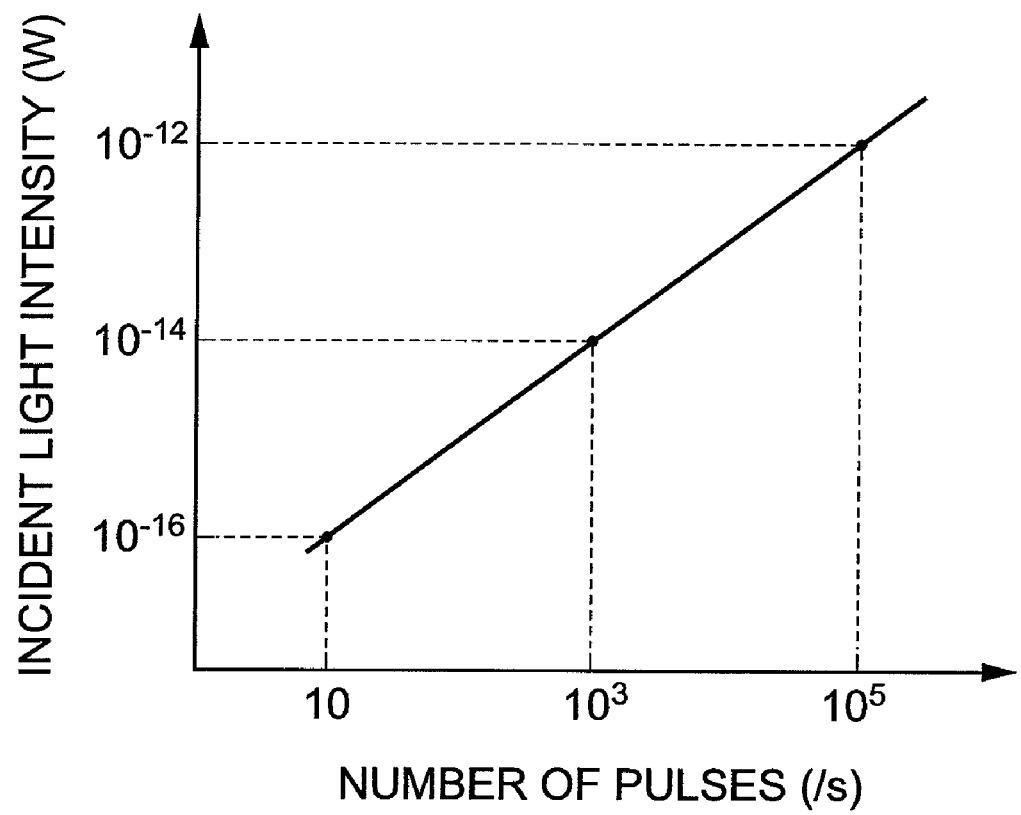
FIG. 3 is a graph showing a relationship between the number of pulses per second of a pulse current outputted from a photomultiplier tube 1 or a square wave outputted from a comparator 5$d$ and the incident light intensity (W).

FIG. 3 is a graph showing a relationship between the number of pulses per second of a pulse current outputted from the photomultiplier tube 1 or a square wave outputted from the comparator 5d and the incident light intensity (W). As shown in this graph, counting the number of pulses allows detecting the incident light intensity (W).

Conventionally, it has also been possible to amplify an output signal of the photomultiplier tube 1 when detecting weak light by use of an analog amplifier, however, an accurate detection is impossible when noise of the analog amplifier is greater than the output signal of the photomultiplier tube 1. Particularly, since noise of the analog amplifier tends to increase with the frequency, such photon counting using the digital circuit 5D as described above is important.

In the photon counting, a digital processing is performed. More specifically, when one photon is made incident into the photocathode 1C of the photomultiplier tube 1, one pulse current is outputted from the photomultiplier tube 1. In a conventional device, when high intensity light is made incident, since the number of incident photons per unit time is so large that the respective pulses cannot be separated, the output has been measured as a continuous quantity. On the other hand, an incidence of weak light can be considered as an incidence of temporally discrete photons. In the case of weak light, the arrival interval of photons is long, and the arrival interval of photons is reduced with an increase in light intensity.

When a pulse current from the photomultiplier tube 1 is converted to a pulse voltage and the pulse voltage is inputted to the comparator 5d, a square wave is outputted every time a crest value of the inputted pulse voltage exceeds a reference threshold voltage of the comparator 5d. More specifically, square waves equal in number to photons made incident in a temporally discrete manner are outputted from the comparator 5d. That is, counting the number of pulses of a square wave as a digital value allows detecting weak light.

Various configurations of the signal processor 5e can be considered.

Figure 4:
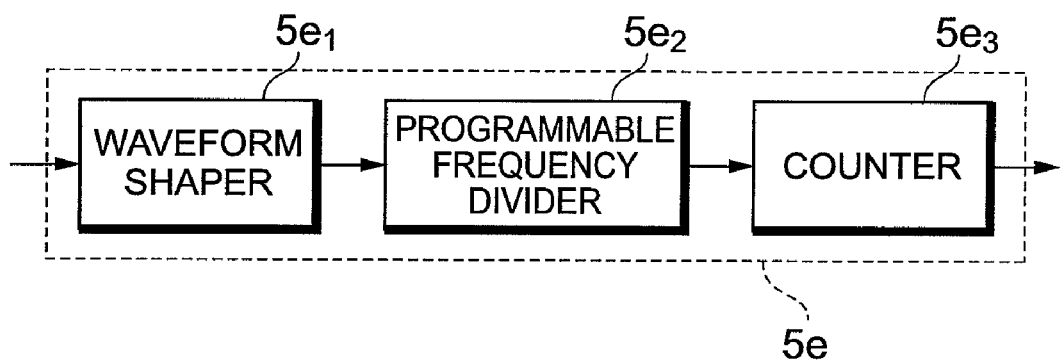
FIG. 4 is a circuit diagram showing an example of a signal processor 5$e$.

FIG. 4 is a circuit diagram showing an example of the signal processor 5e.

A square-wave voltage outputted from the comparator 5d is shaped by the waveform shaper $5e_1$ so as to have a uniform pulse width. An output of the waveform shaper $5e_1$ is inputted to a programmable frequency divider $5e_2$, and the programmable frequency divider $5e_2$ lowers the inputted frequency according to a set dividing ratio. An output of the programmable frequency divider $5e_2$ is inputted to a counter $5e_3$, the number of pulses is counted for a set time, and a digital signal that indicates the incident light intensity as a digital value is outputted.

Also, it is preferable that the comparator 5d and the signal processor 5e are arranged at a position distant from the stem pin SPA, and in other words, these circuits are arranged so as to be closer to the other end portion opposite to the one-end portion 5E than the one-end portion 5E of the board described above, whereby influence of an electromagnetic noise radiated onto the stem pin SPA is suppressed.

When only a square-wave output suffices, it is also possible to have a configuration where the signal processor 5e described above is not mounted on the signal processing board 5.

As has been described above, the above-described structure is effective for photon counting where a weak noise becomes a problem, and by outputting a digital value according to the number of square waves by the signal processor 5e, photodetection of a photon level is enabled.

Figure 5:
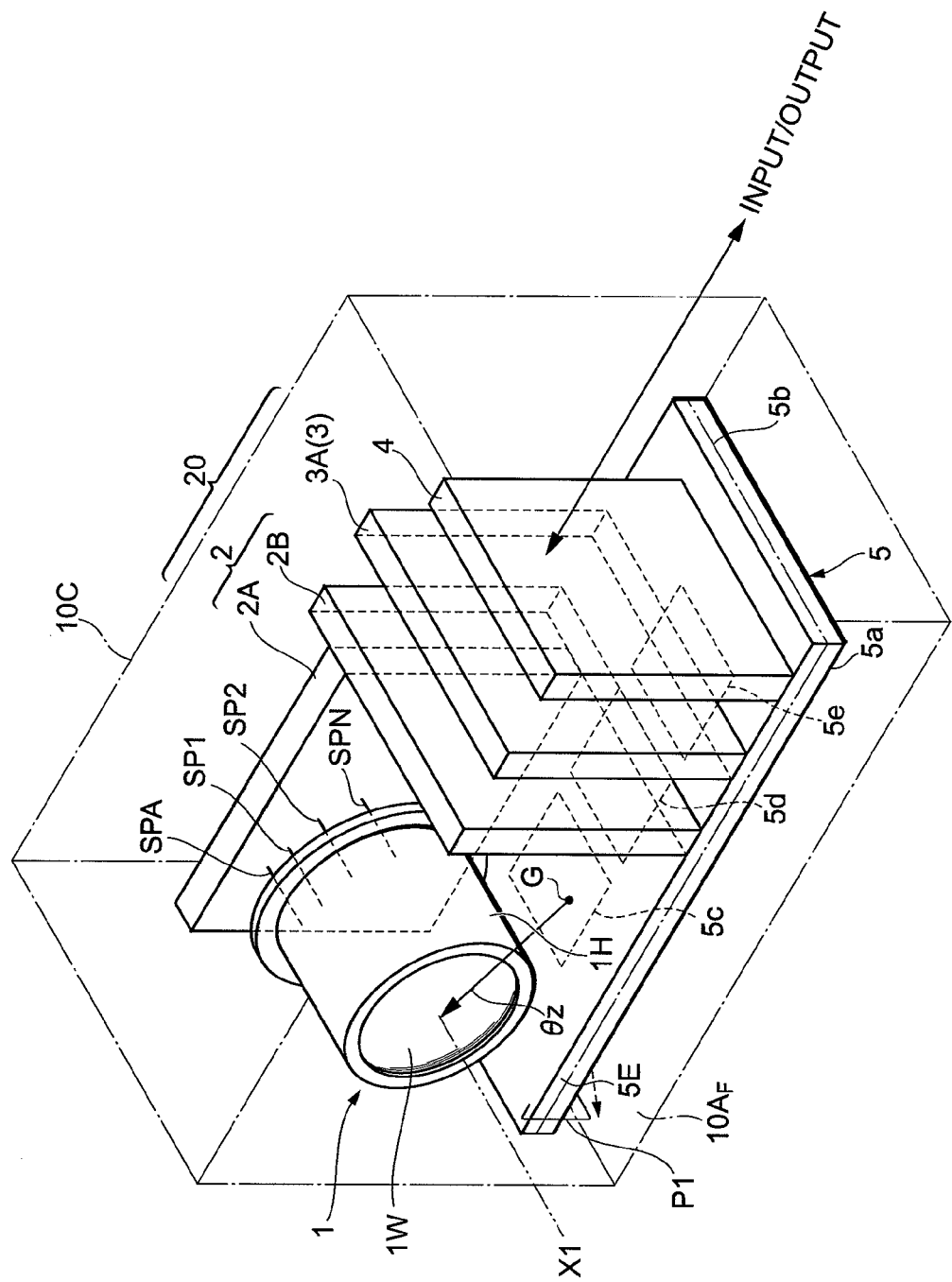
FIG. 5 is a perspective view of a photomultiplier tube module according to another embodiment.

FIG. 5 is a perspective view of a photomultiplier tube module according to another embodiment.

Aspects of the structure other than the arrangement of the photomultiplier tube 1 and the circuit board 2A are the same as those of the above-described embodiment. In the present example, an extension line of a tube axis of the photomultiplier tube is denoted with X1, light is made incident into the light incidence surface 1W of the photomultiplier tube along the extension line X1, and the photomultiplier tube 1 and the circuit board 2A of the above-described embodiment are turned by 90 degrees around the Z-axis.

The extension line X1 of the tube axis of the photomultiplier tube 1 is shifted from the center of gravity position G of the housing front surface $10A_F$ along a direction θZ, which allows a space to be formed at the opposite side of shifting in the housing. The signal processing board 5 is arranged in this space. The board surface of the signal processing board 5 is vertical to the Z-axis, and its longitudinal direction is parallel to the Y-axis, and its width direction is parallel to the X-axis. The circuit board 2A which is at least a part of the high-voltage generating circuit board 20 is fixed on the extension line X1 of the tube axis, and thus the interior space of the housing 10C can be effectively used. The board surfaces of the other circuit boards 2B, 3A, and 4 are vertical to the Y-axis. In the case of this structure, since the signal processing board 5 can be made adjacent to the tube wall 1H of the photomultiplier tube 1, even when the length in the tube axis direction (X-axis direction) of the signal processing board 5 is long, it becomes possible to house the same in the housing 10C. Therefore, it becomes possible to achieve miniaturization. The current-voltage converter 5c can be formed of a pulse amplifier, and the signal processor 5e arranged at a further position than the comparator 5c is formed of a digital circuit.

Moreover, the photomultiplier tube 1 has a tube axis length shorter than the size of the signal processing board 5 in the direction (X-axis) parallel to the tube axis, and a compact photomultiplier tube module is formed as in the foregoing. Also, the input/output board 4 is connected with a lead wire for a 5V-power supply input, a lead wire for grounding, a lead wire for a signal output, or according to necessity, a lead wire for detecting an over-light detection output.

What is claimed is:

1. A photomultiplier tube module comprising:
a photomultiplier tube which is fixed in a housing, whose light incident surface is arranged on a side of a front surface of said housing, and an extension line of a tube axis of which is provided a position displaced from a center of gravity position of said front surface;
a high-voltage generating circuit board which is fixed in said housing, whose board surface is arranged so as to intersect the extension line of the tube axis, and which applies an operating voltage to said photomultiplier tube;
a signal processing board which is fixed in said housing and located on a side opposite to a direction toward the tube axis from the center of gravity position, whose one end portion is adjacent to a tube wall of said photomultiplier tube, whose board surface is parallel to the tube axis, and which processes an output signal of said photomultiplier tube that flows in from a region on a side of the one-end portion; and
a digital circuit which is provided on an outside surface of said signal processing board located on a side opposite to an inside surface opposed to said photomultiplier tube and which digitally processes an output signal from said photomultiplier tube, wherein said high-voltage generating circuit board is provided on said inside surface of said signal processing board;

said digital circuit comprises a comparator in which an output signal of said photomultiplier tube is inputted and a signal processor that outputs a digital value according to a number of square waves outputted from said comparator; and said comparator and said signal processor are arranged on other end portion opposite to said one end portion of said signal processing board.

2. The photomultiplier tube module according to claim 1, wherein said photomultiplier tube has a tube axis length shorter than a size of said signal processing board in a direction parallel to the tube axis.

3. The photomultiplier tube module according to claim 1, wherein said signal processing board comprises:

a metal layer provided between said digital circuit and said photomultiplier tube and said high-voltage generating circuit board and connected to a ground.

4. The photomultiplier tube module according to claim 3, further comprising a conductive fixing member fixed to an inside surface of a side wall of said housing, said side wall including said front surface, wherein said signal processing board is fixed by said conductive fixing member so that said metal layer is electrically connected to said conductive fixing member, and said housing is formed of a conductive material.

5. The photomultiplier tube module according to claim 1, comprising:

a holder which is fixed to an inside surface of a side wall including said front surface of said housing and which supports a region on a side of the light incident surface of said tube wall of said photomultiplier tube; and a resin material applied between stem pins of said photomultiplier tube and from a region on a side opposite to the light incident surface of said tube wall of said photomultiplier tube to a position to contact said holder.

* * * * *